(12) United States Patent
Bouche et al.

(10) Patent No.: US 10,014,390 B1
(45) Date of Patent: Jul. 3, 2018

(54) INNER SPACER FORMATION FOR NANOSHEET FIELD-EFFECT TRANSISTORS WITH TALL SUSPENSIONS

(71) Applicant: GLOBALFOUNDRIES Inc., Grand Cayman (KY)

(72) Inventors: Guillaume Bouche, Albany, NY (US); Julien Frougier, Albany, NY (US); Ruilong Xie, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/729,105

(22) Filed: Oct. 10, 2017

(51) Int. Cl.
| | |
|---|---|
| *H01L 29/66* | (2006.01) |
| *H01L 29/06* | (2006.01) |
| *H01L 29/78* | (2006.01) |
| H01L 21/308 | (2006.01) |
| H01L 29/423 | (2006.01) |

(52) U.S. Cl.
CPC .... *H01L 29/66553* (2013.01); *H01L 29/0665* (2013.01); *H01L 29/42392* (2013.01); *H01L 29/6681* (2013.01); *H01L 29/66818* (2013.01); *H01L 29/7853* (2013.01); H01L 21/3086 (2013.01); H01L 2029/42388 (2013.01)

(58) Field of Classification Search
CPC ............ H01L 29/66553; H01L 29/0665
See application file for complete search history.

(56) References Cited

U.S. PATENT DOCUMENTS

| | | | |
|---|---|---|---|
| 7,337,420 B2 | 2/2008 | Chidambarrao et al. | |
| 8,050,863 B2 | 11/2011 | Trepagnier et al. | |
| 8,237,228 B2 | 8/2012 | Or-Bach et al. | |
| 8,754,533 B2 | 6/2014 | Or-Bach et al. | |
| 9,146,443 B2 | 9/2015 | Corkery | |
| 9,653,289 B1 * | 5/2017 | Balakrishnan | ........ H01L 27/088 |
| 9,748,335 B1 * | 8/2017 | Bentley | ............... H01L 29/0673 |
| 2003/0043655 A1 | 3/2003 | Vincent et al. | |
| 2005/0151206 A1 | 7/2005 | Schwerin | |

(Continued)

FOREIGN PATENT DOCUMENTS

| | | |
|---|---|---|
| CN | 102671724 A | 9/2012 |
| CN | 102884630 A | 1/2013 |

(Continued)

*Primary Examiner* — Lex Malsawma
*Assistant Examiner* — Xia Cross
(74) *Attorney, Agent, or Firm* — Thompson Hine LLP; Yuanmin Cai (57) ABSTRACT

Structures for a nanosheet field-effect transistor and methods for forming a structure for a nanosheet field-effect transistor. A body feature is formed that includes a first nanosheet channel layer, a second nanosheet channel layer, and first, second, and third sacrificial layers that are vertically arranged between the first and second nanosheet channel layers. The first, second, and third sacrificial layers are laterally recessed relative to the first and second nanosheet channel layers to form a cavity indented into a sidewall of the first body feature. The second sacrificial layer is laterally recessed to a lesser extent than the first sacrificial layer or the third sacrificial layer such that an end of the second sacrificial layer projects into the cavity between the first and third sacrificial layers. A dielectric spacer is formed in the first and second portions of cavity between the first and second nanosheet channel layers.

16 Claims, 5 Drawing Sheets

(56) References Cited

U.S. PATENT DOCUMENTS

| | | |
|---|---|---|
| 2007/0045534 A1 | 3/2007 | Zani et al. |
| 2007/0159880 A1 | 7/2007 | Eitan |
| 2009/0127589 A1 | 5/2009 | Rothberg et al. |
| 2010/0002402 A1 | 1/2010 | Rogers et al. |
| 2010/0069621 A1 | 3/2010 | Maune et al. |
| 2011/0074498 A1 | 3/2011 | Thompson et al. |
| 2011/0092030 A1 | 4/2011 | Or-Bach et al. |
| 2011/0121366 A1 | 5/2011 | Or-Bach et al. |
| 2011/0247934 A1 | 10/2011 | Wang et al. |
| 2011/0298705 A1 | 12/2011 | Vaganov |
| 2012/0157804 A1 | 6/2012 | Rogers et al. |
| 2014/0351551 A1 | 11/2014 | Doerr et al. |
| 2015/0249096 A1 | 9/2015 | Lupino et al. |
| 2015/0253320 A1 | 9/2015 | Kamei et al. |
| 2015/0276489 A1 | 10/2015 | Cumming et al. |
| 2015/0335875 A1 | 11/2015 | Goldwasser et al. |
| 2016/0020305 A1* | 1/2016 | Obradovic .......... H01L 29/7391 257/39 |
| 2017/0117291 A1 | 4/2017 | Or-Bach et al. |
| 2017/0133395 A1 | 5/2017 | Or-Bach et al. |
| 2017/0179151 A1 | 6/2017 | Kai et al. |
| 2017/0194105 A1 | 7/2017 | Zhamu et al. |

FOREIGN PATENT DOCUMENTS

| | | |
|---|---|---|
| EP | 2681545 B1 | 1/2014 |
| EP | 2547253 B1 | 6/2016 |
| KR | 20120124045 A | 11/2012 |
| KR | 20130092472 A | 8/2013 |
| WO | 2011041109 A1 | 4/2011 |
| WO | 2011041110 A1 | 4/2011 |
| WO | 2014165686 A2 | 10/2014 |
| WO | 2016028843 A2 | 2/2016 |
| WO | 2016099580 A2 | 6/2016 |
| WO | 2016178837 A1 | 11/2016 |
| WO | 2016179113 A1 | 11/2016 |
| WO | 2017015765 A1 | 2/2017 |
| WO | 2017116598 A1 | 7/2017 |
| WO | 2017123416 A1 | 7/2017 |

* cited by examiner

INNER SPACER FORMATION FOR NANOSHEET FIELD-EFFECT TRANSISTORS WITH TALL SUSPENSIONS

BACKGROUND

The present invention relates to semiconductor device fabrication and integrated circuits and, more specifically, to structures for a nanosheet field-effect transistor and methods of forming a structure for a nanosheet field-effect transistor.

Device structures for a field-effect transistor generally include a body region, a source and a drain defined in the body region, and a gate electrode configured to switch carrier flow in a channel formed in the body region. When a control voltage exceeding a designated threshold voltage is applied to the gate electrode, carrier flow occurs in an inversion or depletion layer in the channel between the source and drain to produce a device output current. The body region and channel of a planar field-effect transistor are located beneath the top surface of a substrate on which the gate electrode is supported.

A fin-type field-effect transistor (FinFET) is a non-planar device structure for a field-effect transistor that may be more densely packed in an integrated circuit than planar field-effect transistors. A FinFET includes a fin that defines a body region of semiconductor material, heavily-doped source/drain regions formed in sections of the body, and a gate electrode that wraps around a channel located in the fin body during operation between the source/drain regions. In comparison with planar field-effect transistors, the arrangement between the gate structure and fin body improves control over the channel and reduces the leakage current when the FinFET is in its 'Off' state. This, in turn, enables the use of lower threshold voltages than in planar field-effect transistors, and results in improved performance and lowered power consumption.

Nanosheet field-effect transistors have been developed as an advanced type of FinFET that may permit additional increases in packing density in an integrated circuit. The body of a nanosheet field-effect transistor includes multiple nanosheet channel layers vertically stacked in a three-dimensional array. Sections of a gate stack may surround all sides of the individual nanosheet channel layers in a gate-all-around arrangement. The nanosheet channel layers are initially arranged in a layer stack with sacrificial layers composed of a material (e.g., silicon-germanium) that can be etched selectively to the material (e.g., silicon) constituting the nanosheet channel layers. The sacrificial layers are etched and removed in order to release the nanosheet channel layers, and to provide spaces for the formation of the gate stack.

SUMMARY

In embodiments of the invention, a method is provided for forming a field-effect transistor. The method includes forming a first body feature that includes a first nanosheet channel layer, a second nanosheet channel layer, and a plurality of sacrificial layers vertically arranged between the first nanosheet channel layer and the second nanosheet channel layer. The sacrificial layers include a first sacrificial layer, a second sacrificial layer, and a third sacrificial layer that are vertically arranged with the second sacrificial layer between the first sacrificial layer and the third sacrificial layer. The method further includes laterally recessing the first sacrificial layer, the second sacrificial layer, and the third sacrificial layer relative to the first nanosheet channel layer to form a cavity indented into a sidewall of the first body feature. The second sacrificial layer is laterally recessed to a lesser extent than the first sacrificial layer or the third sacrificial layer such that an end of the second sacrificial layer projects into the cavity to divide the cavity into a first portion of the cavity between the first nanosheet channel layer and the second sacrificial layer and a second portion of the cavity between the second nanosheet channel layer and the second sacrificial layer. The method further includes depositing a conformal dielectric layer in the first portion of the cavity and in the second portion of the cavity in order to form a dielectric spacer between the first nanosheet channel layer and the second nanosheet channel layer.

In embodiments of the invention, a structure is provided for a field-effect transistor. The structure includes a first body feature including a first nanosheet channel layer and a second nanosheet channel layer spaced vertically from the first nanosheet channel layer by a first distance, and a second body feature including a first nanosheet channel layer and a second nanosheet channel layer spaced vertically from the first nanosheet channel layer by a second distance. The structure further includes a first dielectric spacer arranged vertically between the first nanosheet channel layer and the second nanosheet channel layer of the first body feature, and a second dielectric spacer arranged vertically between the first nanosheet channel layer and the second nanosheet channel layer of the second body feature. The first dielectric spacer has a height equal to the first distance, and the second dielectric spacer has a height equal to the second distance. The first body feature is separated from the second body feature by a gap with a width that is less than the height of the first dielectric spacer and that is less than the height of the second dielectric spacer.

BRIEF DESCRIPTION OF THE DRAWINGS

The accompanying drawings, which are incorporated in and constitute a part of this specification, illustrate various embodiments of the invention and, together with a general description given above and the detailed description given below, serve to explain the embodiments of the invention.

DETAILED DESCRIPTION

Figure 1:
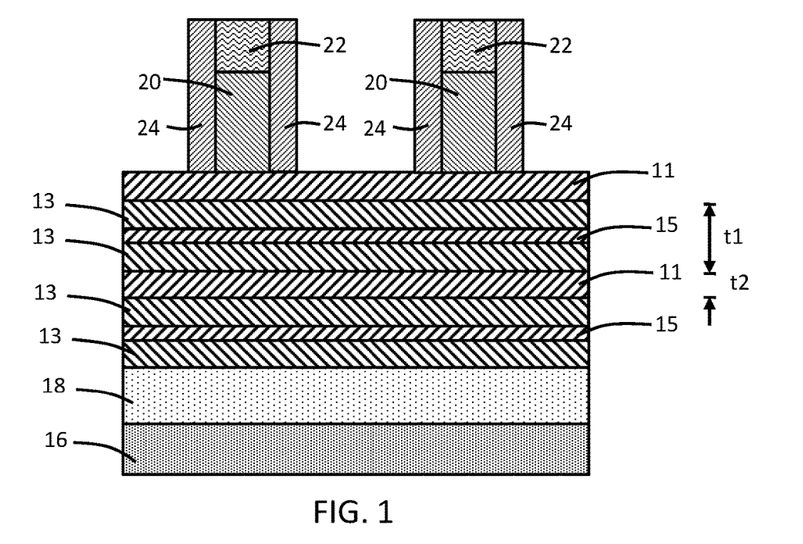
FIGS. 1-9 are cross-sectional views of a device structure at successive fabrication stages of a processing method in accordance with embodiments of the invention.

With reference to FIG. 1 and in accordance with embodiments of the invention, semiconductor layers 11, semiconductor layers 13, and semiconductor layers 15 are formed in a layer stack on a substrate 16. Each of the semiconductor layers 15 is arranged between an adjacent pair of the semiconductor layers 13. The substrate 16 is composed of a semiconductor material, such as single crystal silicon. The semiconductor layers 11, 13, 15 may be sequentially formed by an epitaxial growth process with the composition alternated during growth through a selection of the reactants. The number of semiconductor layers 11 and semiconductor layers 13 may differ from the depicted representative number.

Each adjacent pair of semiconductor layers 13 and intervening semiconductor layer 15 provide a tall suspension that may be used to increase the vertical separation between adjacent pairs of nanosheet channel layers formed from the semiconductor layers 11 in the completed device structure. The collective thickness, t1, of the composite structure is greater than the thickness, t2, of the semiconductor layers 11. By way of numerical example and not limitation, the semiconductor layers 13 may have a thickness of eight (8) nanometers and the semiconductor layer 15 may have a thickness of two (2) nanometers to ten (10) nanometers to provide a composite thickness of eighteen (18) nanometers to twenty-six (26) nanometers, and the semiconductor layers 11 may have a thickness of eight (8) nanometers.

The semiconductor layers 11 and 15 are each composed of a semiconductor material, and the semiconductor layers 13 are composed of a semiconductor material that is selected to be removed selective to the semiconductor material of the semiconductor layers 11 and to the semiconductor material of the semiconductor layers 15. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. In an embodiment, the semiconductor layers 11 and the semiconductor layers 15 may be composed of silicon (Si), and the semiconductor layers 13 may be composed of silicon germanium (SiGe) with a germanium content of twenty percent (20%) to sixty percent (60%) that etches at a higher rate than silicon. In an alternative embodiment, the semiconductor layers 15 may be composed of silicon germanium (SiGe) with a germanium content, and the semiconductor layers 13 may be composed of silicon germanium (SiGe) with a germanium content that is 30 percentage points to 40 percentage points greater than the germanium content of the semiconductor layers 15 such that the SiGe constituting the semiconductor layers 13 etches at a higher rate than the SiGe constituting the semiconductor layers 15. By way of numerical example and not limitation, the semiconductor layers 15 may have a germanium content of fifteen percent (15%) and the semiconductor layers 13 may have a germanium content of fifty percent (50%) to provide a 35 percentage point difference.

After the semiconductor layers 11, 13, 15 are formed, a dielectric layer 18 may be formed that electrically isolates the semiconductor layers 11, 13, 15 from the substrate 16. The dielectric layer 18 may be formed by etching beneath the semiconductor layers 11, 13, 15 or by removing a sacrificial layer from beneath the semiconductor layers 11, 13, 15, and filling with a dielectric material, such as silicon dioxide ($SiO_2$), or a variety of different materials, such as silicon nitride ($Si_3N_4$), SiBCN, carbon-doped silicon nitride (SiNC), SiN, SiCO, SiNOC, etc.

Sacrificial gate structures 20 are formed on the top surface of the topmost semiconductor layer 11 of the layer stack. The sacrificial gate structure 20 may be composed of a semiconductor material, such as amorphous silicon, that is deposited by CVD and patterned with reactive ion etching (RIE) using a hardmask. Each of the sacrificial gate structures 20 is covered by a dielectric cap 22 located on its top surface. In an embodiment, the sacrificial gate structures 20 may be formed with a scaled contacted (poly) pitch (CPP) such that the spacing is tight.

Dielectric spacers 24 are formed on the top surface of the topmost semiconductor layer 11 of the layer stack at locations adjacent to the vertical sidewalls of each sacrificial gate structure 20. The dielectric spacers 24 may be composed of a low-k dielectric material, such as SiBCN or SiOCN.

Figure 2:
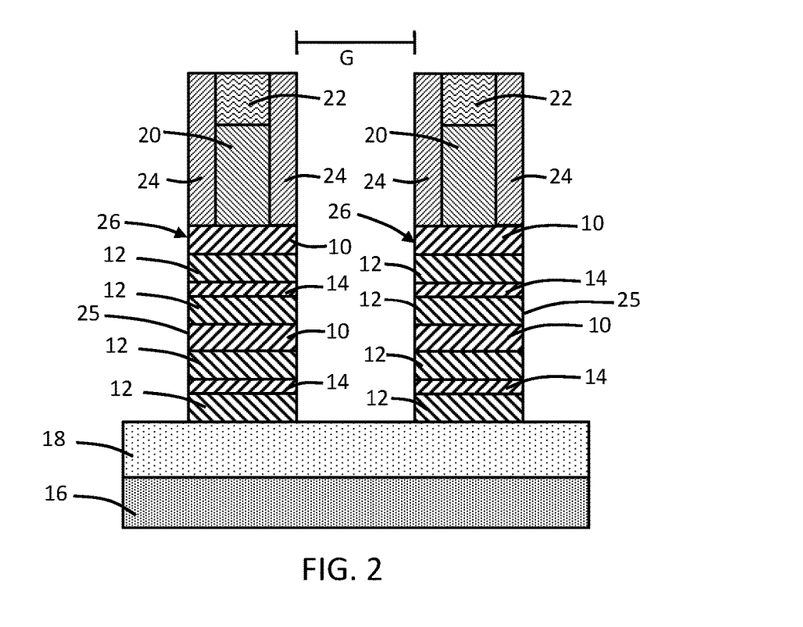

With reference to FIG. 2 in which like reference numerals refer to like features in FIG. 1 and at a subsequent fabrication stage of the processing method, fins or body features 26 are formed from the semiconductor layers 11, 13, 15 of the layer stack by an etching process that relies on the sacrificial gate structure 20 and associated dielectric spacers 24 as an etch mask. The self-aligned etching process, which may be a reactive ion etching (RIE) process, relies on one or more etch chemistries to etch through the semiconductor layers 11, 13, 15 and to stop on the dielectric layer 18. The dielectric layer 18 electrically isolates the body features 26 from the substrate 16.

Each of the body features 26 includes nanosheet channel layers 10 patterned from the semiconductor layers 11, sacrificial layers 12 patterned from the semiconductor layers 13, and sacrificial layers 14 patterned from the semiconductor layers 15. The layers 10, 12, 14 inherit the respective thicknesses of the layers 11, 13, 15. The nanosheet channel layers 10 are arranged to alternate with each set of sacrificial layers 12 and sacrificial layer 14 in a vertical direction, each of the sacrificial layers 14 is arranged vertically between an adjacent pair of the sacrificial layers 12, and the layers 10, 12, 14 are aligned along the sidewalls 25 of each of the body feature 26. The dielectric spacers 24 on adjacent sacrificial gate structures 20 and the sidewalls 25 of adjacent body features 26 are separated apart by a distance defining a gap G.

Figure 3:
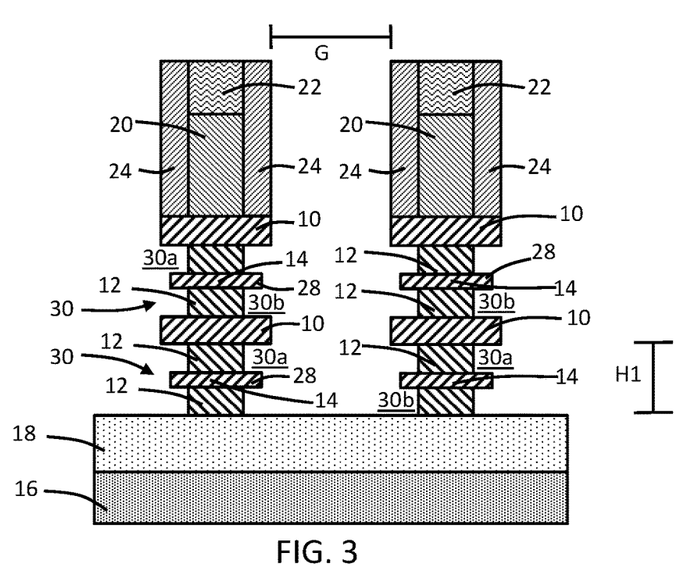

With reference to FIG. 3 in which like reference numerals refer to like features in FIG. 2 and at a subsequent fabrication stage of the processing method, the sacrificial layers 12 and the sacrificial layers 14 are laterally recessed relative to the nanosheet channel layers 10 with a dry or wet isotropic etching process that etches the materials constituting the sacrificial layers 12, 14 selective to the material constituting the nanosheet channel layers 10. The sidewalls 25 of each body feature 26 are indented by cavities, generally indicate by reference numeral 30, where the surfaces of the sacrificial layers 12 are recessed.

The sacrificial layers 14 are etched but to a lesser extent than the sacrificial layers 12 and, as a result, laterally trimmed by the etching process. Following the etching process, their width dimension in a horizontal direction is less than the width dimension of the nanosheet channel layers 10 and greater than the width dimension of the sacrificial layers 12. Due to the thermal budget downstream after the semiconductor layers 11, 13, 15 are epitaxially grown, germanium diffuses to a shallow depth (e.g., 1 to 2 nm in depth) from the semiconductor layers 13 into the semiconductor layers 11 and into the semiconductor layers 15. The resulting presence of a low concentration of germanium in the thin sacrificial layers 14 may cause the lateral trimming of the thin sacrificial layers 14 when the sacrificial layers 12 are laterally recessed. The germanium content of the sacrificial layers 14 (e.g., 1 percent to 15 percent depending on the germanium content of the semiconductor layers 13) is lower than the germanium content of the sacrificial layers 12, which provides a lower etching rate. While not shown in FIG. 3, the nanosheet channel layers 10 may contain a similar content of diffused germanium at a shallow depth across their interfaces with the sacrificial layers 12, and may experience similar erosion with a smaller amount of lateral trimming because the germanium diffusion depth is less than the full thickness of the nanosheet channel layers 12.

As a result of the reduction in their width dimension, each of the sacrificial layers 14 includes protruding ends 28 that are exposed and that project outwardly from the sidewalls 25 into the cavities 30. The ends 28 of the sacrificial layers 14 interrupt the continuity of each cavity 30 and effectively partition or divide each cavity 30 into smaller portions 30a and 30b characterized by a reduced volume. Each cavity 30 has a portion 30a between the associated sacrificial layer 14 and the overlying nanosheet channel layer 10 (i.e., above the sacrificial layer 14) and a portion 30b between the associated sacrificial layer 14 and the underlying nanosheet channel layer 10 (i.e., below the sacrificial layer 14). Each cavity 30 has a height, H1, that may be equally divided between the cavity portions 30a, 30b.

Figure 4:
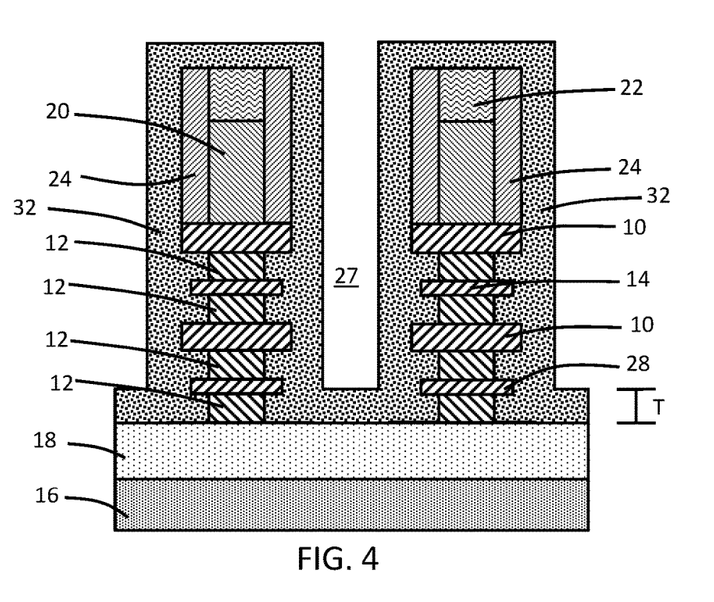

With reference to FIG. 4 in which like reference numerals refer to like features in FIG. 3 and at a subsequent fabrication stage of the processing method, a conformal dielectric layer 32 is deposited across the body features 26 and on the top surface of the dielectric layer 18. The conformal dielectric layer 32 may be composed of a dielectric material, such as silicon nitride ($Si_3N_4$) or a variety of different materials such as SiBCN, SiNC, SiCO, and SiNOC, etc., deposited conformally by atomic layer deposition (ALD). The conformal dielectric layer 32 fills the different portions 30a, 30b of each cavity 30. The interruptions introduced by the protruding ends 28 of the sacrificial layers 14 promote the pinch-off inside the different portions 30a, 30b of each cavity 30 by providing additional surfaces on which the dielectric material of the dielectric layer 32 can form during conformal deposition.

The gap, G, between the body features 26 is narrowed by the conformal dielectric layer 32 deposited on the sidewalls 25 such that a space 27 remains open between the sidewalls 25 of the body features 26. The promotion of pinch-off inside the cavities 30 by the ends 28 of the sacrificial layers 14 permits the thickness T of the dielectric layer 32 to be selected to avoid pinch-off in the gap G between the body features 26. In the absence of the protruding ends 28 of the sacrificial layer 14, the dielectric layer 32 could conformally coat the exposed surfaces at the sidewalls 25 at a layer thickness that would pinch-off the gap G between the body features 26 to close the space 27 before pinching off the space inside the portions of cavities 30.

The conformal dielectric layer 32 has a thickness, T, that is uniform and position independent. The thickness of the conformal dielectric layer 32 is selected to be less than one-half of the dimension of the gap, G, between the sidewalls 25 of the adjacent body features 26 so as to prevent the space 27 from closing. In embodiments, the height of the dielectric material in each of the cavity portions 30a, 30b may be equal to one-half of the thickness of the conformal dielectric layer 32.

Figure 5:
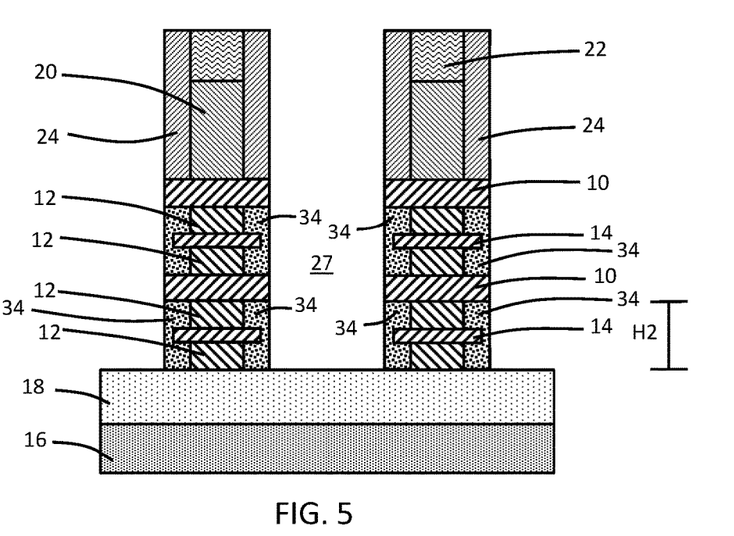

With reference to FIG. 5 in which like reference numerals refer to like features in FIG. 4 and at a subsequent fabrication stage of the processing method, inner spacers 34 are formed from the dielectric layer 32 by an isotropic etching process that completely removes portions of the dielectric layer 32 that are located outside of the cavities 30. An isotropic etching process removes material in multiple directions (e.g., in lateral and vertical directions). The existence of the space 27 promotes the ability to form inner spacers 34 between the adjacent body features 26 that are flush (i.e., coplanar) with the sidewalls 25 of the body features 26. The exposed ends of the sacrificial layers 14, which are narrower than the nanosheet channel layers 10, are embedded within the inner spacers 34. The formation of the inner spacers 34 with a thin liner enabled by the sacrificial layers 14 may promote the scaling of the contacted gate (poly) pitch (CPP) of the body features 26 while enabling tall suspensions at the scaled CPP. The gap G is cleared of the dielectric material of the dielectric layer 32 and has a width dimension equal to the perpendicular distance between the adjacent sidewalls 25 of the body features 26.

Each of the inner spacers 34 has a height, H2, that is equal to the height of the cavity 30 in which it is formed. The height of each inner spacer 34 may be equally divided between a portion in the cavity portion 30a (FIG. 3) and another portion in the cavity portion 30b (FIG. 3). Each of the portions of the inner spacers 34 in the cavity portions 30a, 30b will have a height equal to one half of the height of the cavity 30, and a height equal to twice the thickness of the conformal dielectric layer 32.

Figure 6:
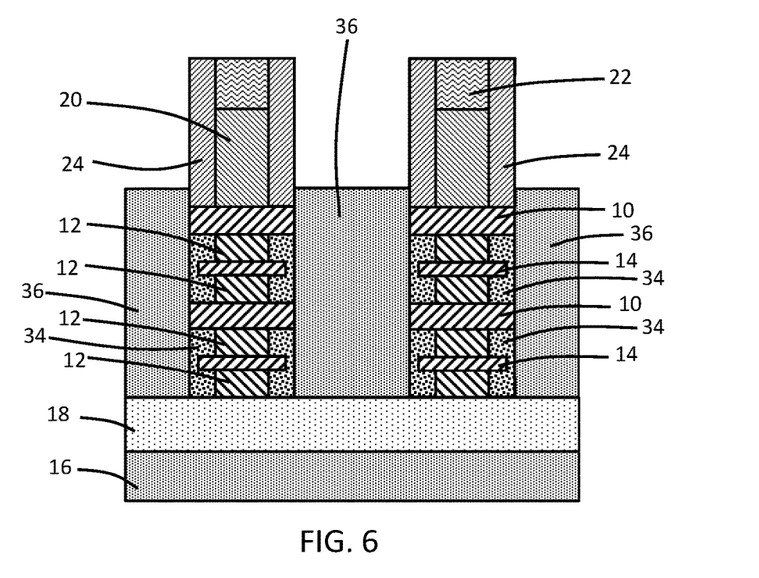

With reference to FIG. 6 in which like reference numerals refer to like features in FIG. 5 and at a subsequent fabrication stage of the processing method, source/drain regions 36 of semiconductor material are epitaxially grown from the exposed surfaces of the nanosheet channel layers 10 at the sidewalls 25 of the body features 26. As used herein, the term "source/drain region" means a doped region of semiconductor material that can function as either a source or a drain of a nanosheet field-effect transistor. The source/drain regions 36 are physically isolated from the sacrificial layers 12 and the sacrificial layers 14 by the inner spacers 34. The source/drain regions 36 are electrically isolated from the substrate 16 by the dielectric layer 18.

The source/drain regions 36 may be formed by an epitaxial growth process in which the semiconductor material grows from growth seeds provided by the exposed surfaces of the nanosheet channel layers 10 at the sidewalls 25 of the body features 26 and merges in the gap 27 between adjacent body features 26. In an embodiment, the source/drain regions 36 may be formed by a selective epitaxial growth (SEG) process in which semiconductor material nucleates for epitaxial growth on single-crystal surfaces (e.g., the nanosheet channel layers 10), but does not nucleate for epitaxial growth from insulator surfaces (e.g., the inner spacers 34, the dielectric spacers 24, and the dielectric layer 18). In the latter regard, the inner spacers 34 cover the sacrificial layers 12 and the sacrificial layers 14, and thereby prevent unwanted epitaxial growth from the sacrificial layers 12, 14.

The semiconductor material constituting the source/drain regions 36 may be heavily doped to have either p-type electrical conductivity or n-type electrical conductivity depending on the type of nanosheet field-effect transistor being formed. In an embodiment forming an n-type nanosheet field-effect transistor, the source/drain regions 36 may be doped during epitaxial growth with an n-type dopant from Group V of the Periodic Table (e.g., phosphorus (P) and/or arsenic (As)) that provides n-type electrical conductivity to the semiconductor material. In an embodiment forming a p-type nanosheet field-effect transistor, the source/drain regions 36 may be doped during epitaxial growth with a p-type dopant from Group III of the Periodic Table (e.g., boron (B), aluminum (Al), gallium (Ga), and/or indium (In)) that provides p-type electrical conductivity to the semiconductor material.

Figure 7:
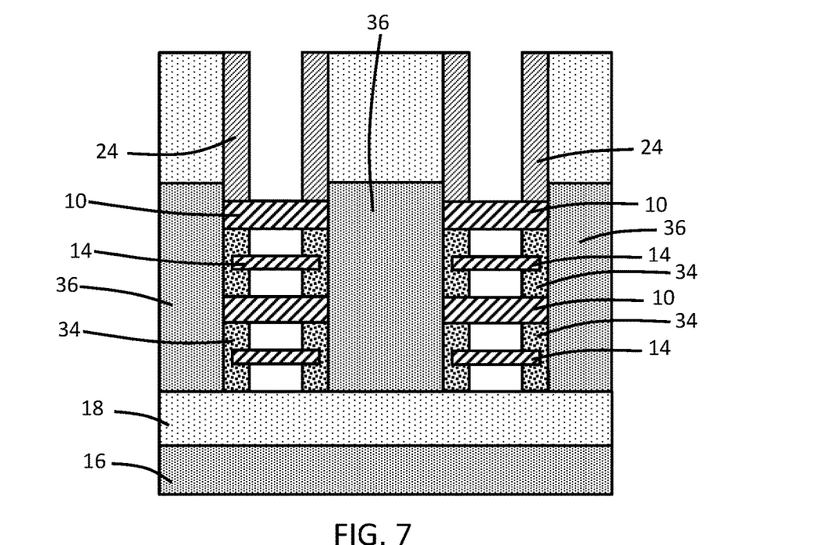

With reference to FIG. 7 in which like reference numerals refer to like features in FIG. 6 and at a subsequent fabrication stage of the processing method, a dielectric layer 40 composed of a dielectric material, such as silicon dioxide ($SiO_2$), may be deposited and planarized. The planarization may remove the dielectric caps 22 and expose the sacrificial gate structures 20. The sacrificial gate structures 20 and sacrificial layers 12 may be sequentially removed with one or more etching processes that remove their materials selective to the materials of the nanosheet channel layers 10 and the inner spacers 34 to release the nanosheet channel layers 10. The sacrificial gate structures 20 and then the sacrificial layers 12 may be etched and removed using, for example, hot ammonia and/or hydrochloric acid (HCl) vapor. The sacrificial layers 14 are not removed when the sacrificial layers 12 are removed. In alternative embodiments, the sacrificial layers 14 may be partially removed when the sacrificial layers 12 are removed, or may be fully removed when the sacrificial layers 12 are removed.

Figure 8:
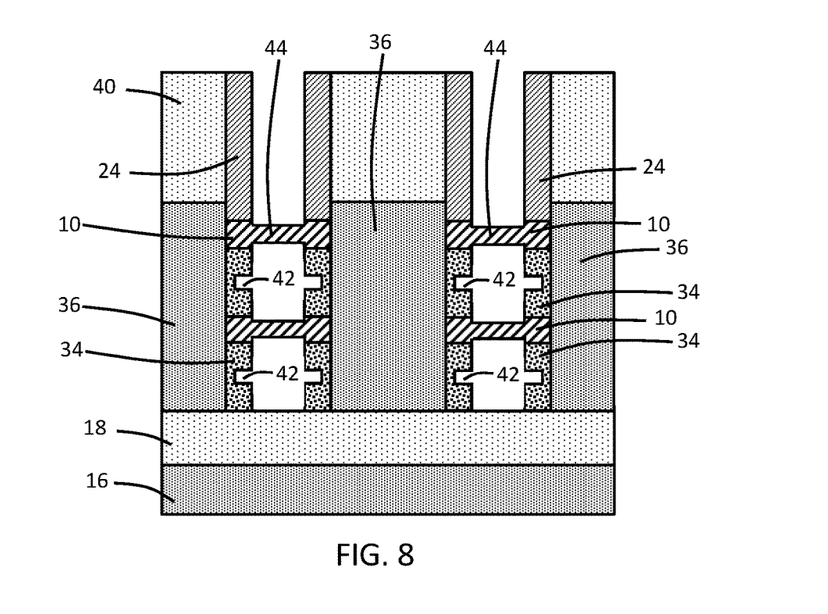

With reference to FIG. 8 in which like reference numerals refer to like features in FIG. 7 and at a subsequent fabrication stage of the processing method, the sacrificial layers 14 are removed with an etching process in order to clear the spaces providing the tall suspensions. In an embodiment in which the sacrificial layers 14 and the nanosheet channel layers 10 are composed of respective materials with the same etch rate or similar etch rates, the removal of the sacrificial layers 14 will thin the exposed central regions 44 of the nanosheet channel layers 10. Cavities 42 are formed as a result of the removal of the ends 28 of the sacrificial layers 14 from the inner spacers 34 on the side on the inner spacers 34 opposite from the side adjacent to the source/drain regions 36 and facing toward sections of the subsequently-formed gate structures. The cavity 42 in each inner spacer 34 may be vertically located at equal distances from the nearest pair of nanosheet channel layers 10. The inner spacers 34 function to mask and hermetically seal the source/drain regions 36 from the etching process removing the sacrificial layers 12 to release the nanosheet channel layers 10.

The central regions 44 of the nanosheet channel layers 10 are thinned inwardly from all exposed surfaces. The nanosheet channel layers 10 have multiple thicknesses with thinner central regions 44 arranged horizontally between thicker peripheral regions. The semiconductor layers 11 (FIG. 1), when formed, may have a thickness that is selected to compensate for the thinning of the nanosheet channel layers 10 in the central regions 44. Peripheral sections of the nanosheet channel layers 10, which are arranged vertically between inner spacers 34 and/or dielectric spacers 24, are masked during the etching process. As a result, the peripheral sections of the nanosheet channel layers 10 retain original thickness. The nanosheet channel layers 10 may exhibit a stepped transition or a tapered transition from the peripheral sections to the central region 44.

Figure 9:
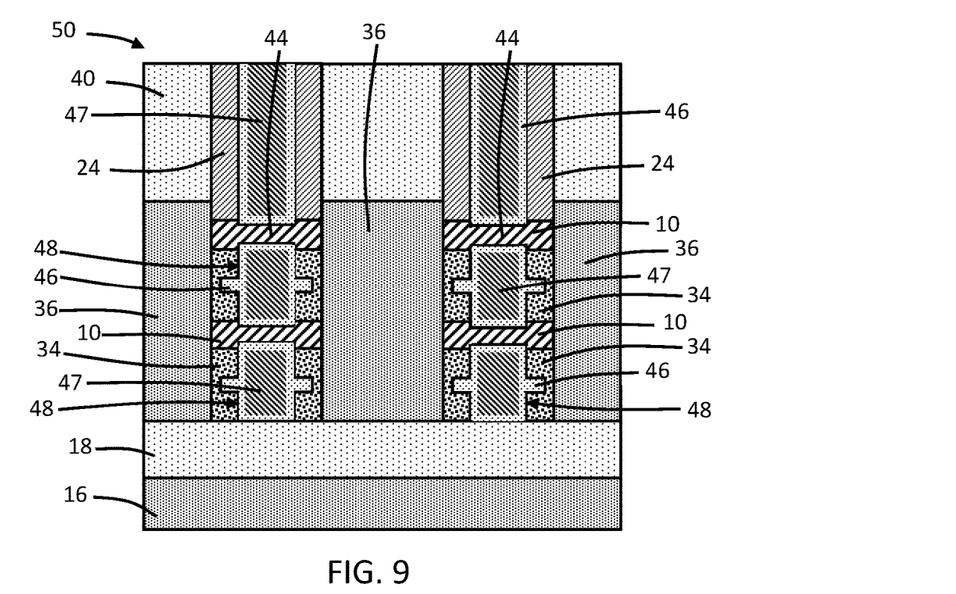

With reference to FIG. 9 in which like reference numerals refer to like features in FIG. 8 and at a subsequent fabrication stage of the processing method, functional gate structures 48 of a field-effect transistor 50 are formed in the opened spaces surrounding each of the nanosheet channel layers 10 as part of a replacement gate process. The functional gate structures 48 may include a thin oxide layer formed on the surfaces of the nanosheet channel layers 10, a gate dielectric layer 46 composed of a dielectric material, such as a high-k dielectric like hafnium oxide ($HfO_2$), and a metal gate electrode 47. The gate dielectric layer 46 is arranged between the metal gate electrode 47 and the thin oxide layer on the exterior surfaces of the nanosheet channel layers 10. The metal gate electrode 47 includes one or more conformal barrier metal layers and/or work function metal layers, such as layers composed of titanium aluminum carbide (TiAlC) and/or titanium nitride (TiN), and a metal gate fill layer composed of a conductor, such as tungsten (W). The term "sacrificial gate structure" as used herein refers to a placeholder structure for a functional gate structure to be subsequently formed. The term "functional gate structure" as used herein refers to a permanent gate structure used to control output current (i.e., flow of carriers in the channel) of a field-effect transistor.

The nanosheet channel layers 10 of the field-effect transistor 50 are arranged in a vertical stack. Sections of the functional gate structure 48 are located in the spaces formerly occupied by the removed sacrificial layers 12 and surround an exterior surface of the nanosheet channel layers 10 in a gate-all-around arrangement in which sections of the functional gate structure 48 are wrapped about the individual nanosheet channel layers 10. The nanosheet channel layers 10 function as channels for carrier flow that are formed during operation of the field-effect transistor 50. The inner spacers 34 are arranged between the sections of the functional gate structure 48 and the source/drain regions 36 of the epitaxial semiconductor material. The cavities 42 in the inner spacers 34 may be filled by portions of the gate dielectric layer 46 through, for example, pinchoff during the deposition of the gate dielectric layer 46.

Middle-of-line (MOL) and back-end-of-line (BEOL) processing follow, which includes formation of contacts and wiring for the local interconnect structure overlying the device structure, and formation of dielectric layers, via plugs, and wiring for an interconnect structure coupled by the interconnect wiring with the functional gate structures 48 and source/drain regions 36 of the field-effect transistor 50.

Figure 10:
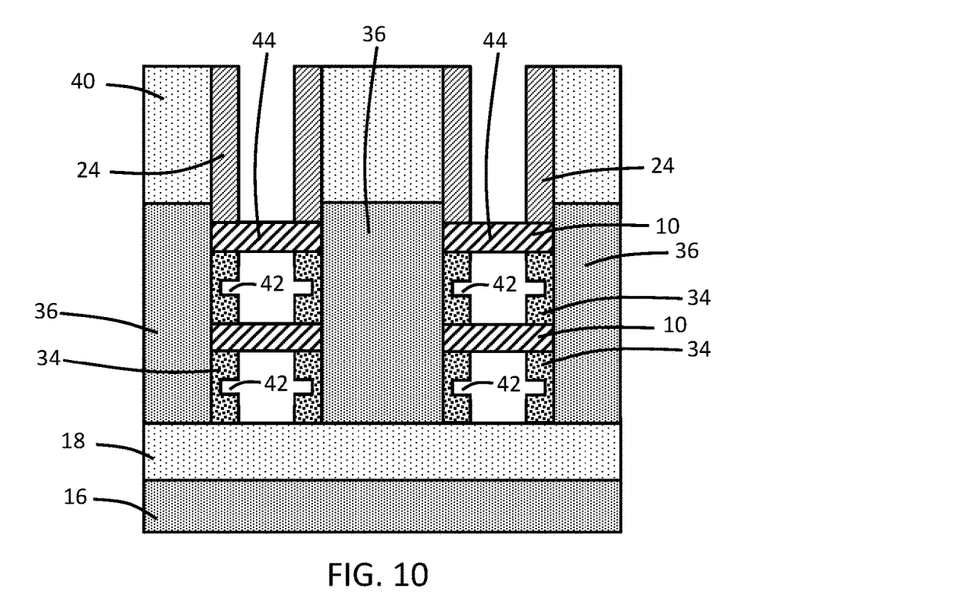
FIG. 10 is a cross-sectional view at a fabrication stage subsequent to FIG. 6 of a device structure in accordance with alternative embodiments of the invention.

With reference to FIG. 10 in which like reference numerals refer to like features in FIG. 6 and at a subsequent fabrication stage in accordance with alternative embodiments of the processing method, the sacrificial layers 14 may be completely removed to form cavities 42 when the sacrificial layers 12 are removed if the sacrificial layers 14 and the sacrificial layers 12 are composed of respective materials with the same etch rate or similar etch rates. As a result, a separate etching process (FIG. 8) is not needed to remove the sacrificial layers 14 and the central regions 44 of the nanosheet channel layers 10 are not thinned. After the concurrent removal of sacrificial layers 12 and sacrificial layers 14, the process flow continues as described in connection with FIG. 9 to produce the field-effect transistor 50 with nanosheet channel layers 10 that are not thinned.

The principles of the embodiments of the invention may enable tall suspension for different vertically stacked architectures, such as a nanosheet field-effect transistor as described herein, as well as, a nanowire field-effect transistor, a nanoellipse field-effect transistor, or a 3D monolithic complementary field-effect transistor. The tall suspensions are readily scalable through the selection of thicknesses for the semiconductor layers 13 and 15 used to respectively form the sacrificial layers 12 and the sacrificial layers 14.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a field-effect transistor, the method comprising:
   forming a first body feature that includes a first nanosheet channel layer, a second nanosheet channel layer, and a plurality of sacrificial layers vertically arranged between the first nanosheet channel layer and the second nanosheet channel layer, wherein the sacrificial layers include a first sacrificial layer, a second sacrificial layer, and a third sacrificial layer that are vertically arranged with the second sacrificial layer between the first sacrificial layer and the third sacrificial layer;
   laterally recessing the first sacrificial layer, the second sacrificial layer, and the third sacrificial layer relative to the first nanosheet channel layer to form a cavity indented into a sidewall of the first body feature, wherein the second sacrificial layer is laterally recessed to a lesser extent than the first sacrificial layer or the third sacrificial layer such that an end of the second sacrificial layer projects into the cavity to divide the cavity into a first portion between the first nanosheet channel layer and the second sacrificial layer and a second portion between the second nanosheet channel layer and the second sacrificial layer; and
   depositing a conformal dielectric layer in the first portion of the cavity and in the second portion of the cavity in order to form a dielectric spacer between the first nanosheet channel layer and the second nanosheet channel layer.

2. The method of claim 1 wherein the first nanosheet channel layer and the second sacrificial layer are composed of silicon, and the first sacrificial layer and the third sacrificial layer are composed of silicon-germanium.

3. The method of claim 1 wherein the first nanosheet channel layer is composed of silicon, the first sacrificial layer and the third sacrificial layer are composed of silicon-germanium with a first germanium content, and the second sacrificial layer is composed of silicon-germanium with a second germanium content that is less than the first germanium content.

4. The method of claim 3 wherein the first germanium content is 30 percentage points to 40 percentage points greater than the first germanium content.

5. The method of claim 1 wherein a second body feature arranged adjacent to the first body feature and separated from the first body feature by a space, and the conformal dielectric layer is deposited across the first body feature and the second body feature.

6. The method of claim 5 wherein the first portion of the cavity and the second portion of the cavity are dimensioned such that the conformal dielectric layer is pinched off to form the dielectric spacer and the space between the first body feature and the second body feature is dimensioned such that the conformal dielectric layer on the first body feature does not merge with the conformal dielectric layer on the second body feature.

7. The method of claim 6 further comprising:
   removing the conformal dielectric layer from the space between the first body feature and the second body feature with an isotropic etching process.

8. The method of claim 7 further comprising:
   epitaxially growing a source/drain region in the space between the first body feature and the second body feature using the first nanosheet channel layer as a growth seed.

9. The method of claim 5 wherein the conformal dielectric layer has a thickness, the first body feature has a sidewall, the second body feature has a sidewall, and the thickness of the conformal dielectric layer is less than one-half of a distance between the sidewall of the first body feature and the sidewall of the second body feature.

10. The method of claim 5 wherein the conformal dielectric layer has a thickness, and a height between the first nanosheet channel layer and the second sacrificial layer within the first portion of the cavity is equal to one-half of the thickness of the conformal dielectric layer.

11. The method of claim 10 wherein a vertical distance between the second nanosheet channel layer and the second sacrificial layer within the second portion of the cavity is equal to one-half of the thickness of the conformal dielectric layer.

12. The method of claim 1 further comprising:
   after forming the dielectric spacer, removing the first sacrificial layer and the third sacrificial layer selective to the first nanosheet channel layer and the second sacrificial layer.

13. The method of claim 12 further comprising:
   after removing the first sacrificial layer and the third sacrificial layer, removing the second sacrificial layer, wherein the first nanosheet channel layer is thinned in response to removing the second sacrificial layer.

14. The method of claim 13 wherein the dielectric spacer includes a cavity formed at a location from which the end of the second sacrificial layer is removed, and further comprising:
   depositing a gate dielectric layer that, in part, fills the cavity in the dielectric spacer.

15. The method of claim 1 further comprising:
   after forming the dielectric spacer, removing the first sacrificial layer, the second sacrificial layer, and the third sacrificial layer selective to the first nanosheet channel layer.

16. The method of claim 15 wherein the dielectric spacer includes a cavity formed at a location from which the end of the second sacrificial layer is removed, and further comprising:

depositing a gate dielectric layer that, in part, fills the cavity in the dielectric spacer.

\* \* \* \* \*